(12) United States Patent
Pedan et al.

(10) Patent No.: US 9,729,903 B2
(45) Date of Patent: Aug. 8, 2017

(54) DATA TRANSMITTING DEVICE AND METHOD

(71) Applicant: SAMSUNG ELECTRONICS CO., LTD., Suwon-si (KR)

(72) Inventors: Stanislav Pedan, Okhtyrka (UA); Oleg Kopysov, Kharkiv (UA); Mykola Raievskyi, Cherkassy (UA)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 115 days.

(21) Appl. No.: 14/587,601

(22) Filed: Dec. 31, 2014

(65) Prior Publication Data

US 2015/0189337 A1     Jul. 2, 2015

Related U.S. Application Data

(60) Provisional application No. 61/926,447, filed on Jan. 13, 2014, provisional application No. 61/922,269, filed on Dec. 31, 2013.

(30) Foreign Application Priority Data

Nov. 11, 2014   (KR) .................. 10-2014-0156241

(51) Int. Cl.
| | | |
|---|---|---|
| *H04N 21/236* | (2011.01) |
| *H04N 21/4385* | (2011.01) |
| *H04N 21/2389* | (2011.01) |
| *H04L 29/06* | (2006.01) |
| *H03M 13/29* | (2006.01) |
| *H03M 13/05* | (2006.01) |
| *H03M 13/00* | (2006.01) |
| *H04N 21/234* | (2011.01) |

(Continued)

(52) U.S. Cl.
CPC ...... *H04N 21/23605* (2013.01); *H03M 13/05* (2013.01); *H03M 13/6306* (2013.01); *H04L 65/4084* (2013.01); *H04L 69/22* (2013.01); *H04N 19/513* (2014.11); *H04N 19/58* (2014.11); *H04N 21/2389* (2013.01); *H04N 21/23406* (2013.01); *H04N 21/4385* (2013.01)

(58) Field of Classification Search
None
See application file for complete search history.

(56) References Cited

U.S. PATENT DOCUMENTS

| | | | |
|---|---|---|---|
| 8,544,052 B2 | 9/2013 | Park et al. | |
| 2004/0064500 A1* | 4/2004 | Kolar ............... | G06F 17/30858 709/202 |

(Continued)

*Primary Examiner* — Mohamed Kamara
*Assistant Examiner* — George Atkins, Jr.
(74) *Attorney, Agent, or Firm* — Sughrue Mion, PLLC

(57) ABSTRACT

A device for transmitting a packet includes a first processor configured to generate a first packet based on a first content; a second processor configured to generate a second packet independently from the first processor based on a second content; a signaling processor configured to generate a signaling packet based on the first content and the second content; and a communication interface configured to transmit the first packet, the second packet, and the signaling packet, wherein the first processor, the second processor, and the signaling processor respectively generate the first packet, the second packet, and the signaling packet in parallel.

25 Claims, 12 Drawing Sheets

(51) Int. Cl.
*H04N 19/513* (2014.01)
*H04N 19/58* (2014.01)

(56) References Cited

U.S. PATENT DOCUMENTS

| | | | | |
|---|---|---|---|---|
| 2009/0310946 | A1* | 12/2009 | Nishio | G11B 27/007 |
| | | | | 386/291 |
| 2012/0183003 | A1 | 7/2012 | Hwang et al. | |
| 2012/0317461 | A1 | 12/2012 | Hwang et al. | |
| 2013/0094563 | A1 | 4/2013 | Bae | |
| 2013/0136193 | A1 | 5/2013 | Hwang et al. | |
| 2014/0307734 | A1* | 10/2014 | Luby | H04L 12/18 |
| | | | | 370/390 |
| 2015/0146798 | A1* | 5/2015 | Lee | H04N 21/23614 |
| | | | | 375/240.28 |
| 2016/0149994 | A1* | 5/2016 | Kitazato | H04N 21/23614 |
| | | | | 709/219 |

* cited by examiner

DATA TRANSMITTING DEVICE AND METHOD

CROSS-REFERENCE TO RELATED APPLICATIONS

This application claims priority from U.S. Provisional Application No. 61/922,269, filed on Dec. 31, 2013 in the US Patent Office, U.S. Provisional Application No. 61/926,447, filed on Jan. 13, 2014 in the US Patent Office and Korean Patent Application No. 10-2014-0156241, filed on Nov. 11, 2014 in the Korean Intellectual Property Office, the disclosures of which are incorporated herein in their entireties by reference.

BACKGROUND

1. Field

One or more exemplary embodiments relate to a device and a method of transmitting data in a moving picture experts group (MPEG) media transport (MMT) format.

2. Description of the Related Art

Recently, the use of multimedia content has rapidly been increasing, and accordingly, the transmission of multimedia content via a device has also been rapidly increasing.

Since there are many cases where multimedia content complies with a moving picture experts group (MPEG) standard, MPEG-related technologies have advanced. Thus, MPEG-H, a next-generation multimedia coding representation and multiplexing transfer standard, has been prepared recently.

Additionally, as content is more frequently used, there are many cases where a plurality of pieces of content are used.

Even though technologies related to MPEG are constantly advancing, a technology of processing a plurality of pieces of content at the same time has not advanced to perform an MPEG media transport (MMT) protocol, a standard for MPEG transport stream (TS).

SUMMARY

One or more exemplary embodiments include a method and a device for processing a plurality of pieces of content that include data in a moving picture experts group (MPEG) media transport (MMT) format.

Additional aspects will be set forth in part in the description which follows and, in part, will be apparent from the description, or may be learned by practice of the presented exemplary embodiments.

According to an aspect of an exemplary embodiment, a device for transmitting a packet may comprise a first processor configured to generate a first packet based on a first content; a second processor configured to generate a second packet based on a second content independently from the first processor; a signaling processor configured to generate a signaling packet based on the first content and the second content; and a communication interface configured to transmit the first packet, the second packet, and the signaling packet, wherein the first processor, the second processor, and the signaling processor may respectively generate the first packet, the second packet, and the signaling packet in parallel.

The second processor and the signaling processor may respectively generate the second packet and the signaling packet while the first processor is generating the first packet.

The device may further comprise: a media data extractor configured to extract source data in response to the first content corresponding to media data; and a file data extractor configured to extract source data in response to the first content not corresponding to media data; wherein the first processor is further configured to generate the first packet based on the extracted source data.

The first processor may comprise a first buffer configured to store the first packet, and the second processor comprises a second buffer configured to store the second packet.

The device may further comprise: a first forward error correction (FEC) module configured to generate a first FEC repair packet and a first FEC source packet based on the first packet; and a second FEC module configured to generate a second FEC repair packet and a second FEC source packet based on the second packet, wherein the communication interface is further configured to transmit the first FEC repair packet, the first FEC source packet, the second FEC repair packet, and the second FEC source packet.

The device may be further configured to determine a number of packets to be generated in parallel based on a number of contents to be transmitted.

The first packet and the second packet may have a moving picture experts group (MPEG) media transport (MMT) format.

According to another aspect of an exemplary embodiment, a device for receiving a packet may comprise: a communication interface configured to receive a first packet, a second packet, and a signaling packet; a first processor configured to generate a first content based on the first packet; a second processor configured to generate a second content based on the second packet independently from the first processor; and a signaling processor configured to generate a signaling content for the first packet and the second packet based on the signaling packet, wherein the first processor, the second processor, and the signaling processor generate the first packet, the second packet, and the signaling packet in parallel.

The second processor and the signaling processor may respectively generate the second packet and the signaling packet while the first processor is generating the first packet.

The device may further comprise: a media data recoverer configured to generate source data in response to the first content corresponding to media data; and a file data recoverer configured to generate source data in response to the first content not corresponding to media data.

The first processor may comprise a first buffer configured to store the first packet, and the second processor may comprise a second buffer configured to store the second packet.

The first packet may comprise a first forward error correction (FEC) packet and a first FEC source packet, and the second packet may comprise a second FEC packet and a second FEC source packet. In addition, the device may further comprise a first FEC module configured to recover the first FEC source packet based on the first FEC repair packet in response to an error occurring in the first packet; and a second FEC module configured to recover the second FEC repair packet based on the second FEC repair packet in response to an error occurring in the second packet.

The device may further comprise a processor configured to determine a number of contents to be generated in parallel based on a number of packets received by the device.

The first packet and the second packet may have a moving picture experts group (MPEG) media transport (MMT) format.

According to another aspect of an exemplary embodiment, a method of transmitting data performed by a transceiver may comprise: generating a first packet based on a first content; generating a second packet based on a second content independently from the generating the first packet; generating a signaling packet based on the first content and the second content; and transmitting the first packet, the second packet, and the signaling packet, wherein the generating the first packet, the second packet, and the signaling packet are performed in parallel.

The generating the first packet, the second packet, and the signaling packet may comprise generating the second packet and the signaling packet while generating the first packet.

The generating the first packet may comprise extracting source data by a media data extractor of the transceiver in response to the first content corresponding to media data, and extracting source data by a file data extractor of the transceiver in response to the first content not corresponding to media data, and wherein the first packet is generated based on the extracted source data.

The generating the first packet and the second packet may comprise: storing the first packet in a first buffer of the transceiver; and storing the second packet in a second buffer of the transceiver.

The generating the first packet may comprise: generating a first forward error correction (FEC) repair packet and a first FEC source packet based on the first packet; and transmitting the FEC repair packet and the first FEC source packet.

The method of transmitting data may further comprise determining a number of packets to be generated in parallel, based on a number of contents to be transmitted.

According to another aspect of an exemplary embodiment, a method of receiving data performed by a transceiver may comprise: receiving a first packet, a second packet, and a signaling packet; generating a first content based on the first packet; generating a second content based on the second packet independently from the generating the first content; and generating a signaling content based on the signaling packet, wherein the generating the first packet, the second packet, and the signaling packet is performed in parallel.

The generating the first packet, the second packet, and the signaling content may comprise generating the second content and the signaling packet while generating the first packet.

The generating the first content may comprise generating source data by a media data recoverer of the transceiver in response to the received first packet corresponding to a media packet, and generating source data by a file data recoverer of the transceiver in response to the received first packet not corresponding to a media packet, wherein the first content is generated based on the source data.

The generating the first packet and the second packet may comprise: storing the first packet in a first buffer of the transceiver; and storing the second packet in a second buffer of the transceiver.

The first packet may comprise a first forward error correction (FEC) packet and a first FEC source packet, and the second packet may comprise a second FEC repair packet and a second FEC source packet, and wherein the generating the first content may comprise recovering the first FEC source packet based on the first FEC repair packet in response an error occurring in the first FEC source packet.

The method of receiving data may further comprise determining a number contents to be generated in parallel based on a number of packets received by the transceiver.

According to another aspect of an exemplary embodiment, a transceiver may comprise: a data extractor configured to extract source data from a first content and a second content; a first error correction module configured to generate a first source packet and a first repair packet based on a first error correction code and the source data extracted from the first content; a second error correction module configured to generate a second source packet and a second repair packet based on a second error correction code and the source data extracted from the second content; and a signal processor configured to extract signaling information from the first content and the second content and generate a signaling packet with the extracted signaling information; wherein the first error correction module, the second error correction module, and the signaling processor may respectively generate the first source packet, the second source packet, and the signaling packet in parallel.

The data extractor may be further configured to extract the source data in a moving picture experts group media transport (MMT) application layer of the transceiver, and the first and second error correction modules may be further configure to generate the first and second source packets in a MMT protocol layer of the transceiver.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
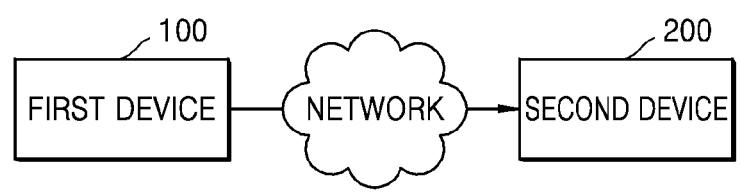
FIG. 1 illustrates an example of a first device and a second device according to an exemplary embodiment.

Exemplary embodiments are described in greater detail below with reference to the accompanying drawings. In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments can be practiced without those specifically defined matters. Also, well-known functions or constructions are not described in detail since they would obscure the description with unnecessary detail. As used herein, the term "and/or" includes any and all combinations of one or more of the associated listed items. Expressions such as "at least one of," when preceding a list of elements, modify the entire list of elements and do not modify the individual elements of the list.

Terms used herein will be briefly described, and exemplary embodiments will be described in detail below.

General and widely-used terms have been employed herein, in consideration of functions provided in the inventive concept, and may vary according to an intention of one of ordinary skill in the art, a precedent, or emergence of new technologies. Additionally, in some cases, an applicant may arbitrarily select specific terms. Then, the applicant will provide the meaning of the terms in the description of exemplary embodiments. Accordingly, It will be understood that the terms, used herein, should be interpreted as having a meaning that is consistent with their meaning in the context of the relevant art and will not be interpreted in an idealized or overly formal sense unless expressly so defined herein.

It will be further understood that the terms "comprises", "comprising", "includes", and/or "including" when used herein, specify the presence of components, but do not preclude the presence or addition of one or more other components, unless otherwise specified. Additionally, a term 'unit' means software or hardware components such as field programmable gate array (FPGA) or application-specific integrated circuit (ASIC), and a "unit" perform some functions. However, a "unit" is not limited to hardware or software. A "unit" may be configured to be included in a storage medium that may be addressed, or configured to play one or more processors. Accordingly, as an example, a "unit" includes components such as software components, object-oriented software components, class components, or task components, processes, functions, attributes, procedures, subroutines, segments of a program code, drivers, firmware, micro-codes, circuits, data, databases, data structures, tables, arrays, or variables. Functions provided in components or "units" may be combined into a small number of components or "units", or separated into additional components or "units".

The term "content" refers to not only information service content used for a system or a service that allows to integrate, generate, transmit, and process various forms of information such as text, voice, or images, but also all types of digital information. Additionally, content may refer to a group of pieces of information that includes data. For example, video data, audio data, images, or text may correspond to content.

Recently, international standardization organization (ISO)/international electrotechnical commission (IEC) joint JTC1/SC29/WG11 is standardizing moving picture experts group (MPEG)-H, a multimedia encoding representation and multiplexing transfer standard which will be used in the ultrahigh-definition TV (UHDTV) era in the future. MPEG-H will be published as a set of standards that consist of systems such as MPEG-H Part 1 system, MPEG-H Part 2 video, and MPEG-H Part 3 audio, similarly to existing MPEG-1, MPEG-2, MPEG-3, or MPEG-4 systems. MPEG media transport (MMT) refers to a Part that is a next-generation multimedia multiplexing transfer standard standardized by MPEG as a follow-up of the MPEG-2 transport system (TS).

MMT asset delivery characteristics (MMT ADC) may include a description related to a quality of service (QoS) requirement for transmitting an MMT asset.

Additionally, MMT composition information (MMT CI) may refer to information for describing a spatial and temporal relation between MMT assets.

An MMT asset may refer to a logical data object that consists of at least one MMT processing unit (MPU) and the same MMT asset identification (ID), or that consists of a particular data block in the format defined by another standard. An MMT asset may include a largest data unit to which the same MMT CI and transmission characteristics are applied.

An MPU may refer to encoded media data that may be completely and independently processed as a general container, independent from any particular media codec.

Data in the MMT format is data generated or consumed by an MMT protocol and may include content in an MMT format.

An MMT protocol (MMTP) packet may refer to a formatted unit of data generated or consumed by an MMT protocol.

FIG. 1 illustrates an example of a first device 100 and a second device 200 according to an exemplary embodiment.

According to an exemplary embodiment, a device for transmitting data in an MPEG media transport (MMT) format may include the first device 100 for transmitting data in an MMT format to the second device 200 and the second device 200 for receiving data in an MMT format.

In other words, if the first device 100 transmits content in an MMT format to the second 200, the second device 200 may receive the content transmitted by the first device 100 and display the received content.

According to an exemplary embodiment, the first device 100 may extract source data from content, generate an MMTP packet by adding additional information to the extracted source data, and then, transmit the generated MMTP packet to the second device 200.

The second device 200 may receive the MMTP packet from the first device 100, generate source data based on the received MMTP packet, and generate content based on the generated source data.

According to an exemplary embodiment, the first device 100 and the second device 200 may be set to be appropriate for an MMT architecture that consists of an MMT application layer, an MMT protocol layer, and a transmission layer.

Additionally, the first device 100 and the second device 200 may be connected to each other via a wired or wireless network.

Figure 2:
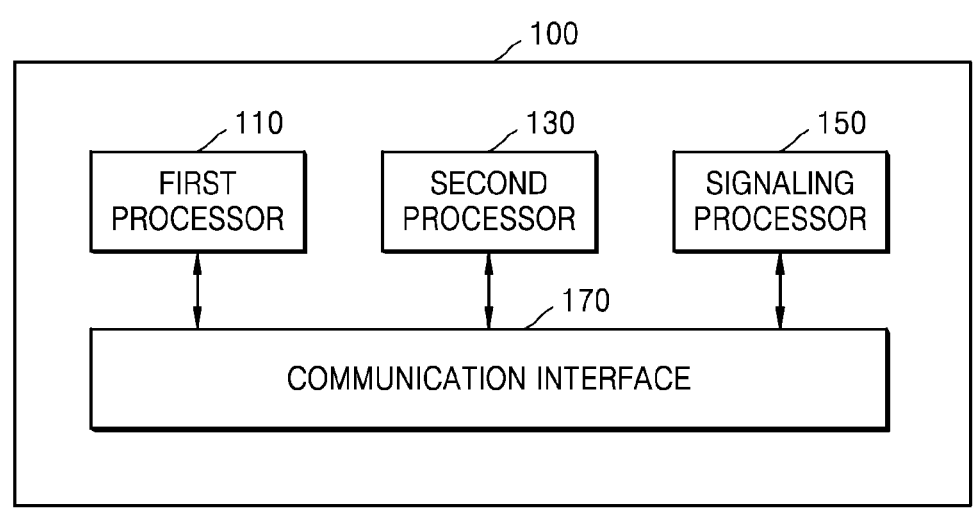
FIG. 2 is a block diagram of the first device according to an exemplary embodiment.

FIG. 2 is a block diagram of the first device 100 according to an exemplary embodiment.

According to an exemplary embodiment, the first device 100 may be a transmission device, and the second device 200 may be a reception device.

According to an exemplary embodiment, the first device 100 may include a first processor 110, a second processor 130, a signaling processor 150, and a communication interface 170.

When the first device 100 includes a single processor processing multiple contents and the multiple contents are transmitted to the second device 200 at the same time, there have been cases where transmission quality is worsened due to an interaction between the contents. According to some exemplary embodiments, an interaction between contents may refer to a phenomenon in which transmission quality is worsened as two or more pieces of content affect each other in a transmission process.

According to exemplary embodiments, if the first device 100 includes a plurality of processors, and each of the plurality of processors independently process multiple contents at the same time, an interaction between the multiple contents may be prevented.

According to some exemplary embodiments, the number of processors included in the first device 100 may correspond to the number of pieces of content that are processed at the same time.

According to an exemplary embodiment, the first processor 110 may generate a first packet based on first content, the second processor 130 may generate a second packet based on second content, and the signaling processor 150 may generate a signaling packet based on the first content and the second content.

According to an embodiment described with reference to FIG. 2, the first processor 110, the second processor 130, and the signaling processor 150 may operate independently, and thus, prevent interaction between content.

Additionally, the first processor 110, the second processor 130, and the signaling processor 150 may operate in parallel. When the first processor 110, the second processor 130, and the signaling processor 150 of the first device 100 are operated in parallel, the second processor 130 and the signaling processor 150 may generate a second packet and a signaling packet, respectively, while the first processor 110 generates a first packet based on first content.

In other words, when the first processor 110, the second processor 130, and the signaling processor 150 are operated in parallel, the first processor 110, the second processor 130, and the signaling processor 150 may perform their respective operations at the same time.

Figure 3:
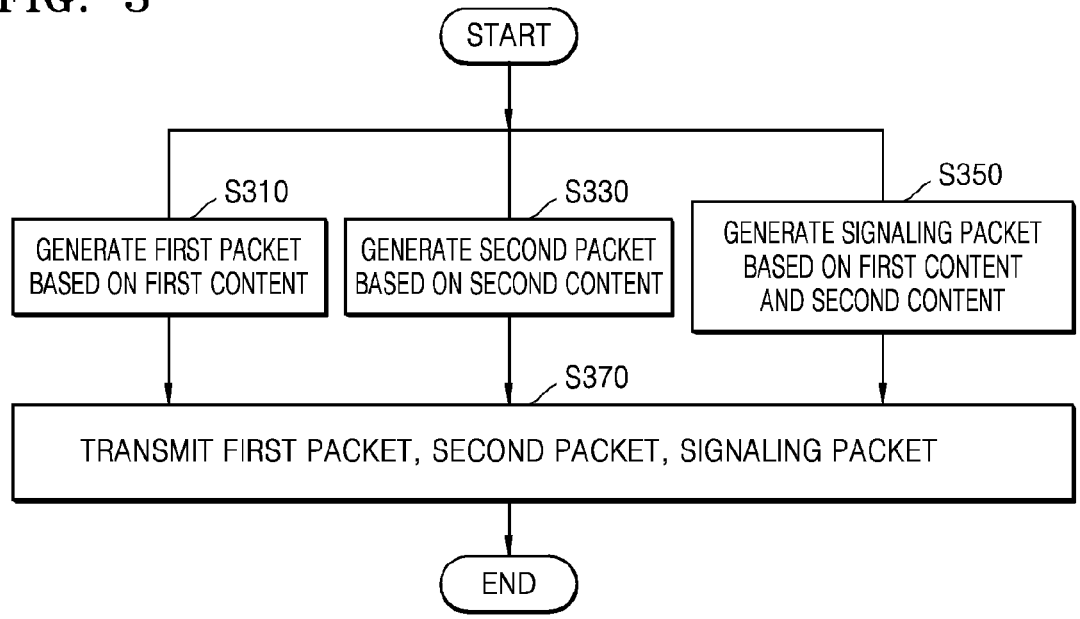
FIG. 3 is a flowchart of a method of transmitting content to the second device, which is performed by the first device, according to an exemplary embodiment.

FIG. 3 is a flowchart of a method of transmitting content to the second device 200, which is performed by the first device 100, according to an exemplary embodiment.

In operation S310, the first device 100 may generate a first packet based on first content. According to some exemplary embodiments, the first device 100 may generate a first packet based on first content by using the first processor 110.

According to some exemplary embodiments, the first device 100 may generate a packet by fragmenting content and adding at least one header to the fragmented content. Data in the packet may include data having a certain size.

According to some exemplary embodiments, the first packet may be a packet in an MMT format. However, the first packet is not limited thereto, and may include a packet in various formats according to various protocols.

In operation S330, the first device 100 may generate a second packet based on second content. According to some exemplary embodiments, the first device 100 may generate a second packet by using the second processor 130 based on the second packet.

According to some exemplary embodiments, the second packet may be a packet in an MMT format. However, the second packet is not limited thereto, and may include a packet in various formats according to various protocols.

In operation S350, the first device 100 may generate a signaling packet based on the first content and the second content. According to some exemplary embodiments, the first device 100 may generate a signaling packet based on the first content and the second content by using the signaling processor 150.

A signaling packet may include information such as MMT asset delivery characteristics (MMT ADC) or MMT composition information (MMT CI) which is extracted from the first content and the second content. According to some exemplary embodiments, operations S310 to S350 may be performed in parallel. Additionally, according to some exemplary embodiments, operations S330 and S350 may be performed while operation S310 is performed. Additionally, according to some exemplary embodiments, operations S330 and S350 may be performed at the same time while operation S310 is performed.

In operation S370, the first device 110 may transmit the first packet, the second packet, and the signaling packet to the second device 130.

According to some exemplary embodiments, the first device 110 may transmit the first packet, the second packet, and the signaling packet to the second device 130 by using the communication interface 170.

According to some exemplary embodiment, the generating the first packet by the first processor 110 in operation S310, the generating the second packet by the second processor 130 in operation S330, and the generating the signaling packet by the signaling processor 150 in operation S350, may be performed in parallel. The communication interface 170 may transmit the packets, generated in operations S310, S330, and S350, to the second device 200.

According to another exemplary embodiment, the first device 100 may include N processors that may generate N packets. In this case, generating the N packets and generating of signaling packets corresponding to the N packets may be performed in parallel.

Figure 4:
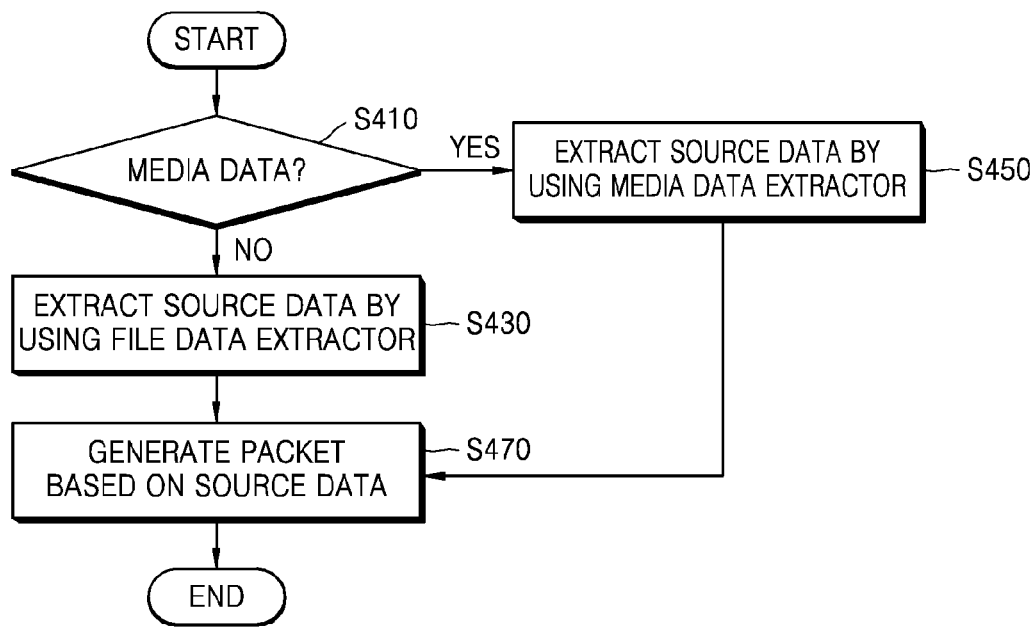
FIG. 4 is a detailed flowchart of a method of generating a packet based on content, which is performed by the first device, according to an exemplary embodiment.

FIG. 4 is a detailed flowchart of a method of generating a packet based on content, which is performed by the first device 100, according to an exemplary embodiment. The content may be either first content or second content.

As shown in FIG. 4, the first device 100 may generate an MMTP packet based on content according to an MMT protocol (MMT) protocol.

According to some exemplary embodiments, an MMTP packet may be generated as follows:

In operation S410, the first device 100 may determine whether content is media data. The first device 100 may check whether the content is in the form of a file with an MMT processing unit (MPU) having a particular structure. If the content has an MPU format, the first device 100 may determine the content as media data.

Figure 8:
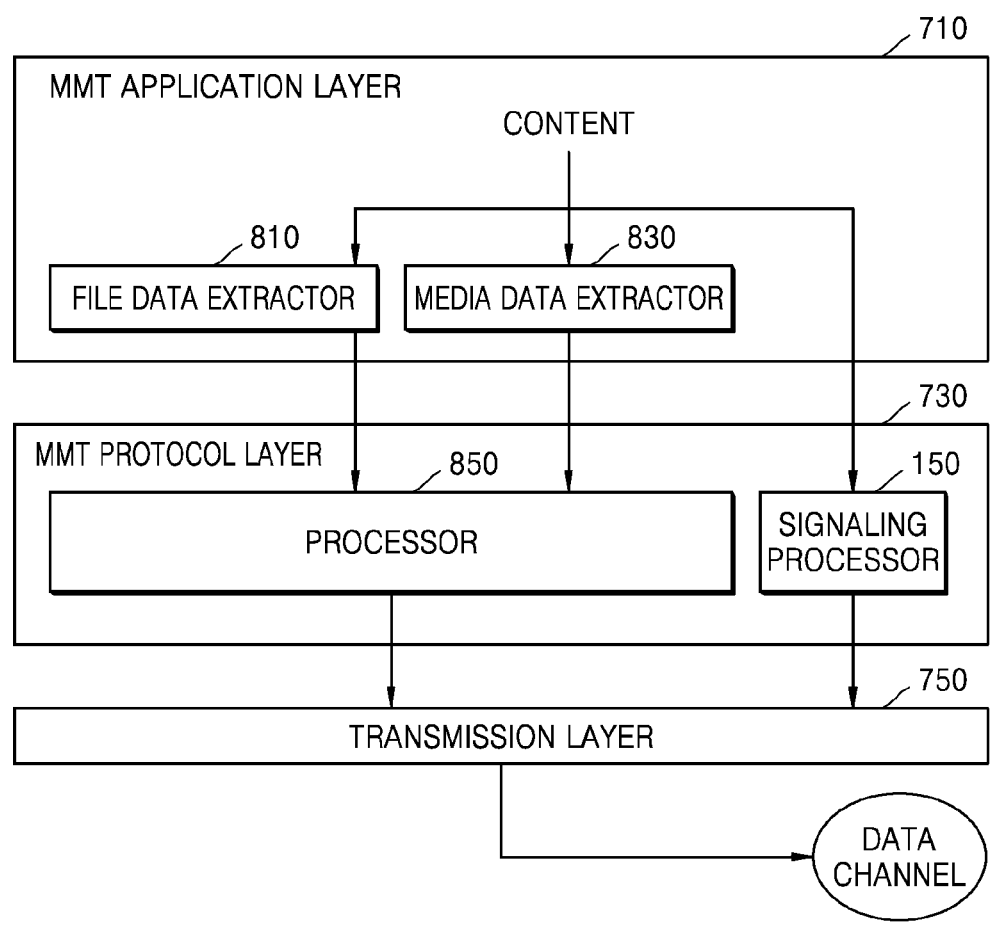
FIG. 8 illustrates a sequential process of transmitting one piece of content to the second device, which is performed by each MMT layer via the first device, according to an exemplary embodiment.

In operation S450, if the content is determined as media data in operation S410, the first device 100 may extract source data, that is, an MPU, by using a media data extractor of the first device 100 (e.g., a media data extractor 830 as shown in FIG. 8).

In operation S430, if the content is determined as not media data in operation S410, the first device 100 may extract source data by using a file data extractor of the first device 100 (e.g., a file data extractor 810 as shown in FIG. 8). According to some exemplary embodiments, the media data extractor 830 and the file data extractor 810 may be included in the first processor 110.

In operation S470, the first device 100 may generate a packet, by packing the source data extracted by the media data extractor 830 or the file data extractor 810. According to some exemplary embodiments, operation S470 may be performed by using the first processor 110 or another processor included in the first device 100.

According to some exemplary embodiments, the operations described with reference to FIG. 4 may be applied to a case where multiple contents are to be transmitted to the second device 200 at the same time. In other words, when a plurality of packets are generated based on different contents, each of the packets may be generated in parallel according to operations S410 to S470 which are described with reference to FIG. 4.

Additionally, according to some exemplary embodiments, the operations of the media data extractor 830 and the file data extractor 810 may be implemented in a data extractor. In this case, the data extractor may extract source data without having to differentiate media data from file data.

Figure 5:
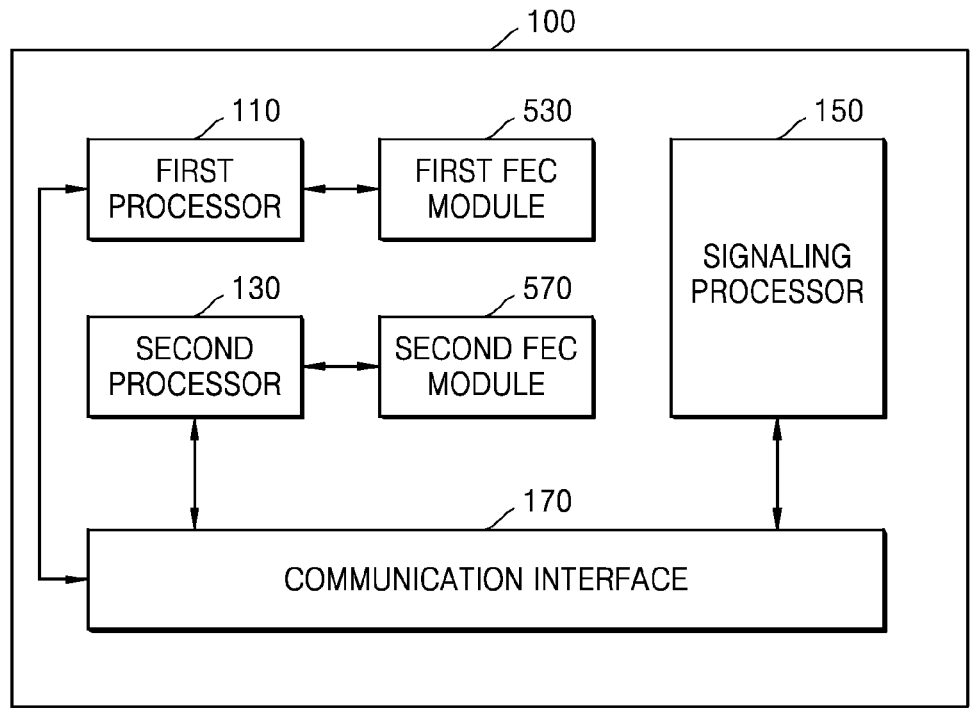
FIG. 5 is a block diagram of the first device for performing forward error correction (FEC) protection and transmitting an FEC-protected packet to the second device, according to an exemplary embodiment.

FIG. 5 is a block diagram of the first device 100 for performing forward error correction (FEC) protection and transmitting an FEC-protected packet to the second device 200, according to an exemplary embodiment.

An MMTP packet may be transmitted from the first device 100 to the second device 200. However, while the MMTP packet is transmitted to the second device 200, an error may occur in the MMTP packet due to an effect such as signal fading or interference.

According to some exemplary embodiments, an error in a packet may include an error or loss of the packet. To correct an error that may occur in a packet, various error correction methods may be used.

According to some exemplary embodiments, the first device 100 and the second device 100 may employ an FEC method to correct an error. However, a method of correcting an error is not limited thereto, and various protection methods such as an automatic repeat request (ARQ) method may be employed.

According to some exemplary embodiments, the first device 100 may further include an FEC module.

According to some exemplary embodiments, the first device 100 may further include a first FEC module 530 for generating a first FEC source packet and a first FEC repair packet based on a first MMTP packet by using a first FEC code, and a second FEC module 570 for generating a second FEC source packet and a second FEC repair packet based on a second MMTP packet by using a second FEC code.

An FEC code may refer to an error correction code for performing self-detection and self-correction of errors.

In the above embodiment, the first FEC module 530 and the second FEC module 570 are independent from each other, and thus, interaction between content may not occur. An FEC source packet is a packet generated based on source data, and an FEC repair packet is a packet that includes data for correcting an error, which may occur in the packet, based on source data. The FEC source packet and the FEC repair packets may allow the second device 200 to correct errors without requesting retransmission.

However, if an error occurs but the error is determined as an error that may not be corrected by using the FEC repair packet, the second device 200 may request the first device 100 to retransmit an FEC source packet and an FEC repair packet.

According to some exemplary embodiments, the communication interface 170 may transmit an FEC source packet and an FEC repair packet generated based on the MMTP packet to the second device 200.

Figure 6:
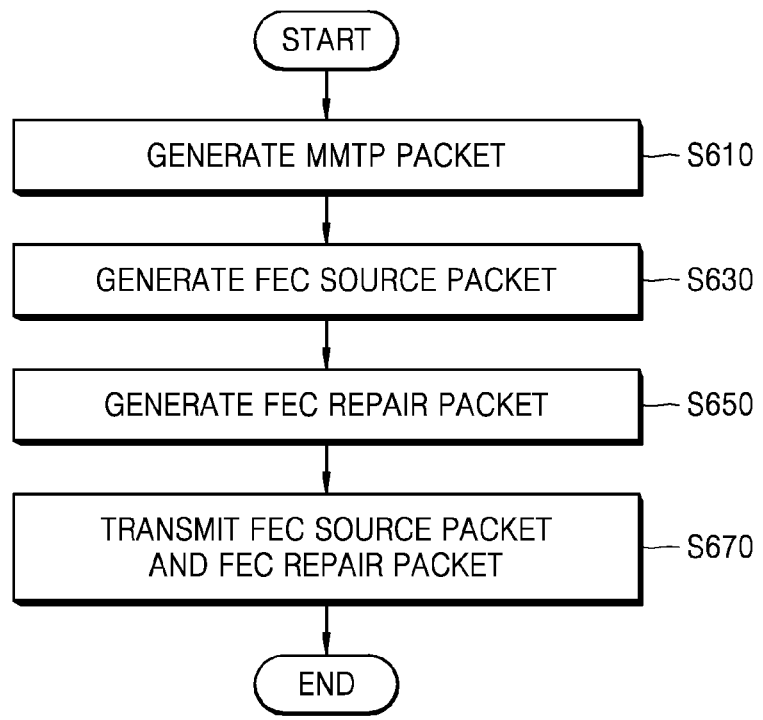
FIG. 6 is a flowchart of a method of performing FEC protection and transmitting data to the second device, which is performed by the first device, according to an exemplary embodiment.

FIG. 6 is a flowchart of a method of performing FEC protection and transmitting data to the second device 200, which is performed by the first device 100, according to an exemplary embodiment.

In operation S610, the first device 100 may generate an MMTP packet based on content. According to some exemplary embodiments, one or more processors included in the first device 100 may respectively generate an MMTP packet based on content.

As described above, the first device 100 may extract source data from the content and generate a packet based on the extracted source data. According to some exemplary embodiments, in operation S630, the first device 100 may generate a repair symbol having a repair payload identifier and a source FEC payload identifier, based on the generated MMTP packet.

In operation S650, the first device 100 may also generate an FEC repair packet by using the repair symbol having the repair payload identifier, and the source FEC payload identifier.

A repair packet refers to a packet used to recover a packet in which an error has occurred. However, this is obvious to one of ordinary skill in the art, and thus, a detailed description thereof will not be provided here.

In operation S670, the communication interface 170 may transmit the FEC source packet and the FEC repair packet generated by the FEC module to the second device 200.

Figure 7:
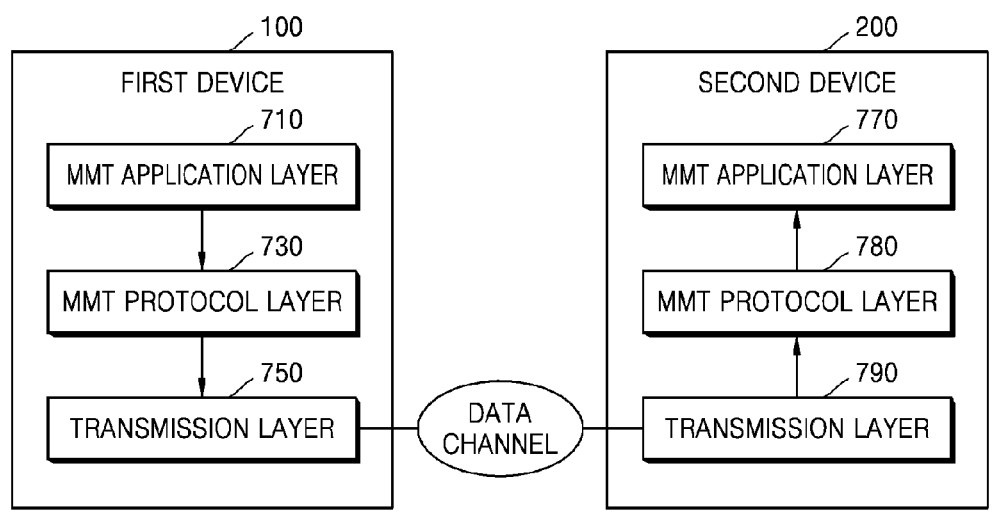
FIG. 7 illustrates respective architectures of the first device and the second device for transceiving data in the moving picture experts group (MPEG) media transport (MMT) format, according to an exemplary embodiment.

FIG. 7 illustrates respective architectures of the first device 100 and the second device 200 for transceiving data in MPEG MMT format, according to an exemplary embodiment.

According to an exemplary embodiment, an MMT architecture may include a logical structure. An architecture may mean a model or a structure of a network which is fragmented by a defined protocol, and elements of the first and second devices 100 and 200 may perform operations that are to be performed at each layer of the architecture.

According to some exemplary embodiments, an MMT architecture of the first device 100 may include an MMT application layer 710, an MMT protocol layer 730, and a transmission layer 750.

According to some exemplary embodiments, an MMT architecture of the second device 200 may include an MMT application layer 770, an MMT protocol layer 780, and a transmission layer 790.

The transmission layer 750 of the first device 100 and the transmission layer 790 of the second device 200 may enable the first device 100 and the second device 200 to communicate each other via a data channel.

According to some exemplary embodiments, in the first device 100, the MMT application layer 710 may extract source data based on content, the MMT protocol layer 730 may generate a packet based on the extracted source data, and the transmission layer 750 may transmit the packet generated by the MMT protocol layer 730 to the second device 200.

According to some exemplary embodiments, in the second device 200, the transmission layer 790 may receive a packet from the first device 100, the MMT protocol layer 780 may generate source data based on the received packet, and he MMT application layer 770 may recover content based on the source data.

FIG. 8 illustrates a sequential process of transmitting one piece of content to the second device 200, which is performed by each MMT layer via the first device 100, according to an exemplary embodiment.

According to some exemplary embodiments, the MMT application layer 710 may extract source data from content.

According to some exemplary embodiments, if content is media data, the source data may be extracted by the media data extractor 830. If content is not media data, the source data may be extracted by the file data extractor 810.

A process of extracting source data based on content via the MMT application layer 710 may correspond to the description provided with reference to FIG. 4.

A packet may be generated based on the extracted source data via the MMT protocol layer 730.

According to some exemplary embodiments, a processor 850 may pack the source data by adding information to the source data extracted by the MMT application layer 710. Thus, an MMTP packet may be generated.

The signaling processor 150 may generate a signaling packet by extracting information such as MMT ADC or MMT CI from content.

According to some exemplary embodiments, the first device 100 may transmit a signaling message to the second device 200. Conversely, the second device 200 may transmit a signaling message to the first device 100.

Additionally, according to some exemplary embodiments, if the second device 200 transmits a signaling message to the first device 100, the first device 100 may receive the signaling packet from the second device 200, and the signaling processor 150 of the first device 100 may unpack the signaling packet.

The packet generated by the MMT protocol layer 730 may be transmitted to the second device 200 via the transmission layer 750.

Setting the transmission layer 750 for transmitting an MMTP packet to the second device 200 may be different from setting the transmission layer 750 for transmitting a signaling packet to the second device 200. For example, if data is transmitted in a channel with a lot of noise, an MMTP packet may be transmitted from an upper layer of a user datagram protocol (UDP) after FEC encoding is performed whereas a signaling message is transmitted from an upper layer of a transmission control protocol (TCP).

Figure 9:
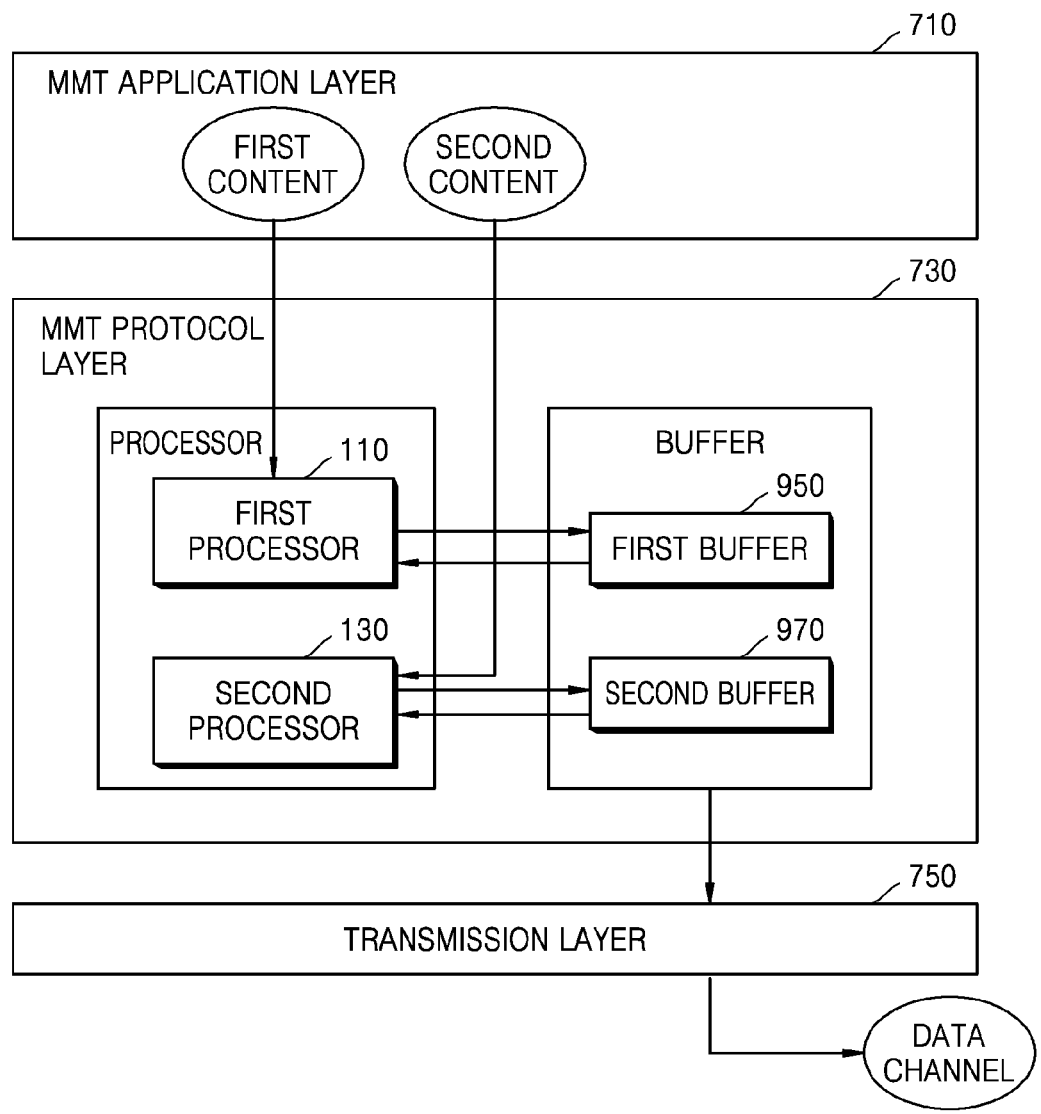
FIG. 9 illustrates a process of transmitting two pieces of content in parallel to the second device, which is performed by the first device, according to another exemplary embodiment.

FIG. 9 illustrates a process of transmitting two pieces of content in parallel to the second device 200, which is performed by the first device 100, according to another exemplary embodiment.

According to some exemplary embodiments, the first processor 110 may temporarily store a first MMTP packet, generated based on first content, in a first buffer 950. Additionally, the second processor 130 may temporarily store a second MMTP packet, generated based on second content, in a second buffer 970.

According to some exemplary embodiments, generating a first MMTP packet and a second MMTP packet and respectively storing the generated first MMTP packet and second MMTP packet in the first buffer 950 and the second buffer 970 may be performed by the MMT protocol layer 730 via the first processor 110 and the second processor 130.

According to some exemplary embodiments, a first process that includes a sequential operation performed by the first processor 110 and the first buffer 950 and a second process that includes a sequential operation performed by the second processor 130 and the second buffer 970 may be present independently from each other.

According to some exemplary embodiments, the first processor 110 may include the first buffer 950, and the second processor 130 may include the second buffer 970.

According to some exemplary embodiments, generating of a first MMTP packet based on first content, generating of a second packet based on second content, and generating of a signaling packet based on first content and second content, which are performed in parallel, may correspond to the description provided with reference to FIG. 3.

Figure 10:
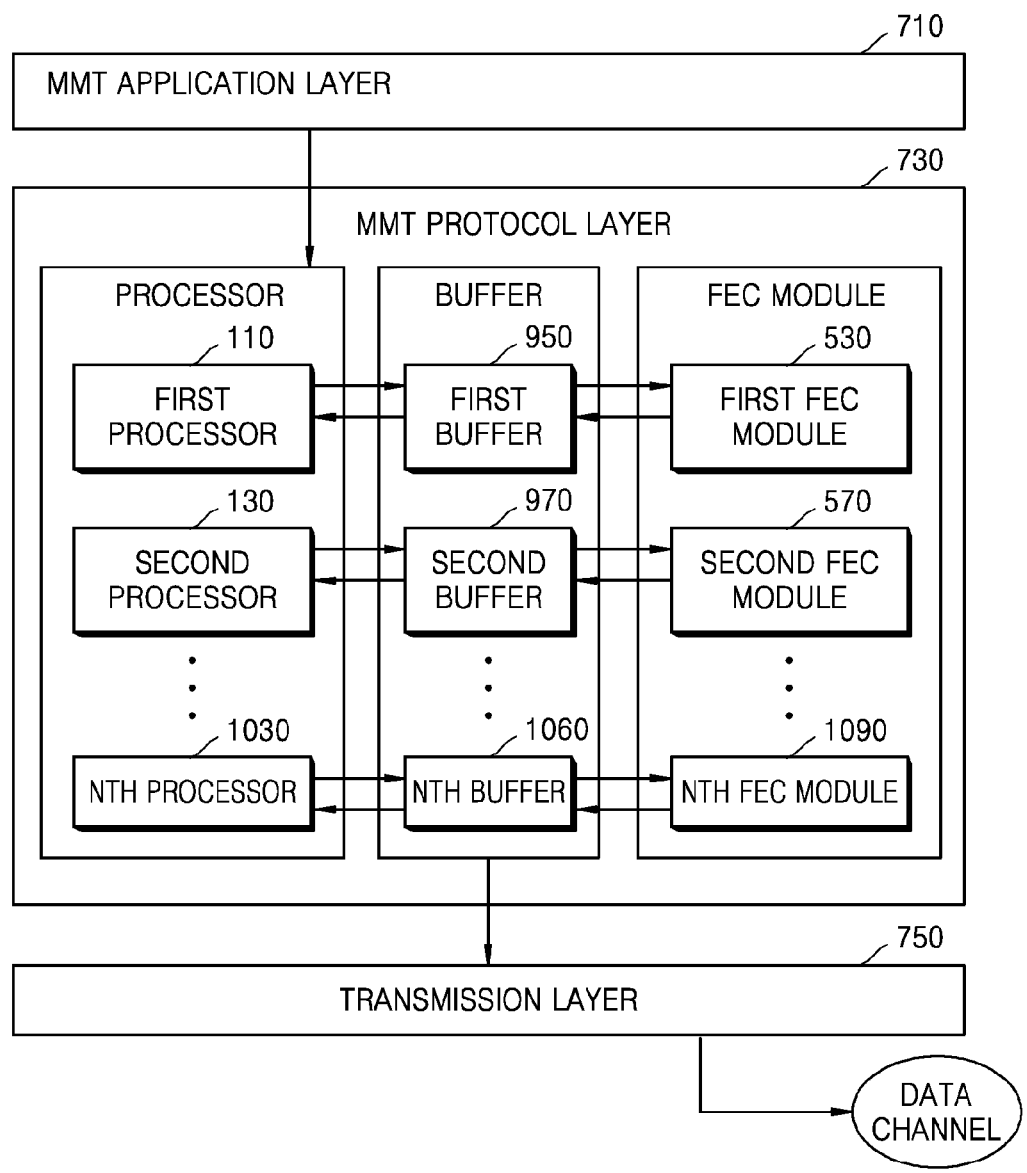
FIG. 10 illustrates a sequential process of transmitting N pieces of content to the second device, which is performed by each MMT layer via the first device, according to an exemplary embodiment.

FIG. 10 illustrates a sequential process of transmitting N pieces of content to the second device, which is performed by each MMT layer via the first device, according to an exemplary embodiment.

According to some exemplary embodiments, the first device 100 may allocate processors, buffers, and FEC modules in correspondence with the number of pieces of content to be transmitted.

According to some exemplary embodiments, the first device 100 may generate a first MMTP packet based on first content, store the generated first MMTP packet in the first buffer 950, and generate an FEC source packet and an FEC repair packet by using an FEC code via the first FEC module 530. According to some exemplary embodiments, a process of generating an FEC source packet and an FEC repair packet may correspond to a process described with reference to FIG. 6. Additionally, the first device 100 may generate a second MMTP packet based on second content, store the generated second MMTP packet in the second buffer 970, and generate an FEC source packet and an FEC repair packet by using an FEC code via the second FEC module 570.

The same packing process may be performed with correspondence with the number of pieces of content. Thus, the first device 100 may generate an Nth MMTP packet based on Nth content, store the generated Nth MMTP packet in an Nth buffer 1060, and generate an FEC source packet and an FEC repair packet by using an FEC code via an Nth FEC module 1090.

Respective processes of processing each content may be performed in parallel. However, even if some parts of the respective processes are performed at the same time, the respective processes may be independently performed without having to interact with each other.

The transmission layer 750 may transmit the first to Nth FEC source packets and the first to Nth FEC repair packets to the second device 200.

However, if the first device 100 and the second device 200 do not perform FEC encoding and decoding, the transmission layer 750 may transmit the first to the Nth MMTP packets to the second device 200.

Figure 11:
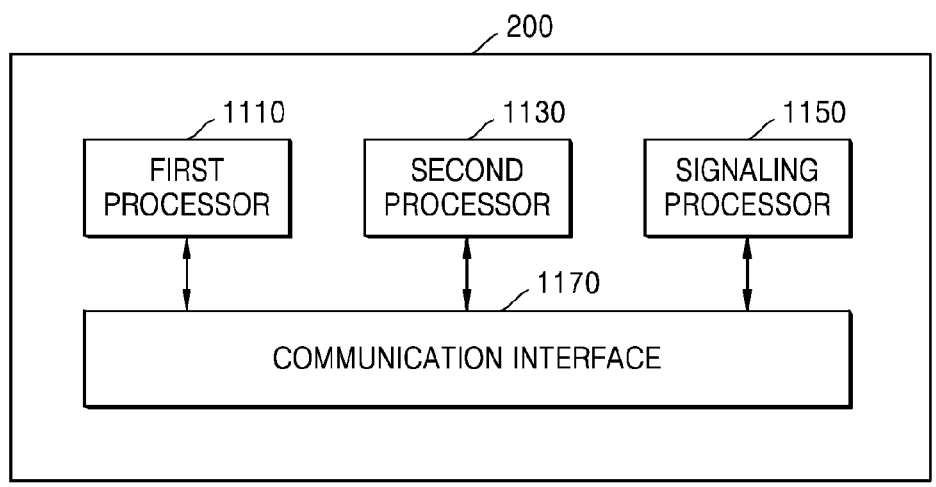
FIG. 11 is a block diagram of the second device, according to an exemplary embodiment.

FIG. 11 is a block diagram of the second device 200, according to an exemplary embodiment.

According to an exemplary embodiment, the second device 200 may include a first processor 1110, a second processor 1130, a signaling processor 1150, and a communication interface 1170.

As shown in FIG. 11, the first processor 1110 may generate first content based on a first packet, the second processor 1130 may generate second content based on a second packet, and the signaling processor 1150 may generate signaling content based on a signaling packet.

The first processor 1110, the second processor 1130, and the signaling processor 1150 may operate independently, and thus, prevent interaction between contents generated by the processors 1100, 1130, and 1150.

Additionally, the first processor 1110, the second processor 1130, and the signaling processor 1150 may operate in parallel. When the first processor 110, the second processor 130, and the signaling processor 150 are operated in parallel, the second processor 130 and the signaling processor 150 respectively generate a second packet and a signal packet, while the first processor 1110 generates a first packet based on first content.

In other words, all or some operations of the first processor 110, the second processor 130, and the signaling processor 150 may be simultaneously performed in parallel.

Figure 12:
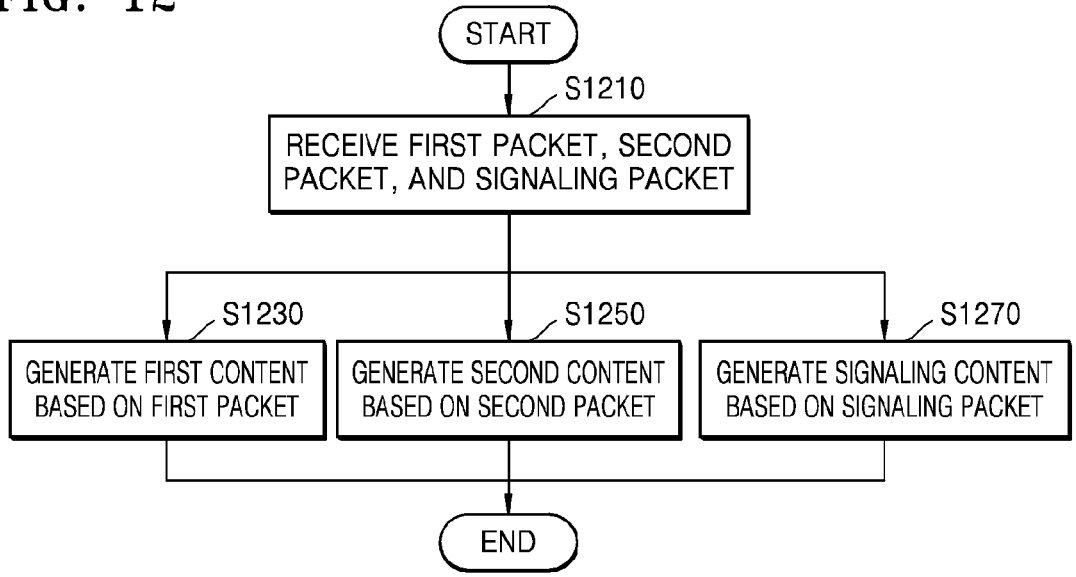
FIG. 12 is a flowchart of a method of receiving a packet, which is performed by the second device, according to an exemplary embodiment.

FIG. 12 is a flowchart of a method of receiving a packet, which is performed by the second device 200, according to an exemplary embodiment.

In operation S1210, the second device 200 may receive a first packet, a second packet, and a signaling packet. According to some exemplary embodiments, the second device 200 may receive a first packet, a second packet, and a signaling packet by using the communication interface 1170.

According to some exemplary embodiments, the first packet may include a first FEC source packet and a first FEC repair packet. The second packet may include a second FEC source packet and a second FEC repair packet.

In operation S1230, the second device 200 may generate first content based on the first packet. According to some exemplary embodiments, the second device 200 may generate first content based on the first packet by using the first processor 1110.

In operation S1250, the second device 200 may generate second content based on the second packet. According to some exemplary embodiments, the second device 200 may generate second content based on the second packet by using the second processor 1130.

In operation S1270, the second device 200 may generate signaling content based on the signaling packet. According to some exemplary embodiments, the second device 200 may generate signaling content based on the signaling packet by using the signaling processor 1150.

According to some exemplary embodiments, operations S1230 to S1270 may be performed in parallel. According to some exemplary embodiments, operations S1250 and operations S1270 may be performed while operation S1230 is performed. Additionally, according to some exemplary embodiments, operations S1250 and S1270 may be performed at the same time while operation S1230 is performed.

According to some exemplary embodiments, in operation S1210, the communication interface 1170 may receive a packet from the first device 100.

If two packets are received from the first device 100, the second device 200 may generate first content based on the first packet in operation S1230, generate second content based on the second packet in operation S1250, and generate signaling content based on the signaling packet in operation S1270 in parallel.

According to another exemplary embodiment, if N packets are received from the first device 100, the second device 200 may generate N pieces of content and generate signaling packets corresponding to the N pieces of content in parallel.

Figure 13:
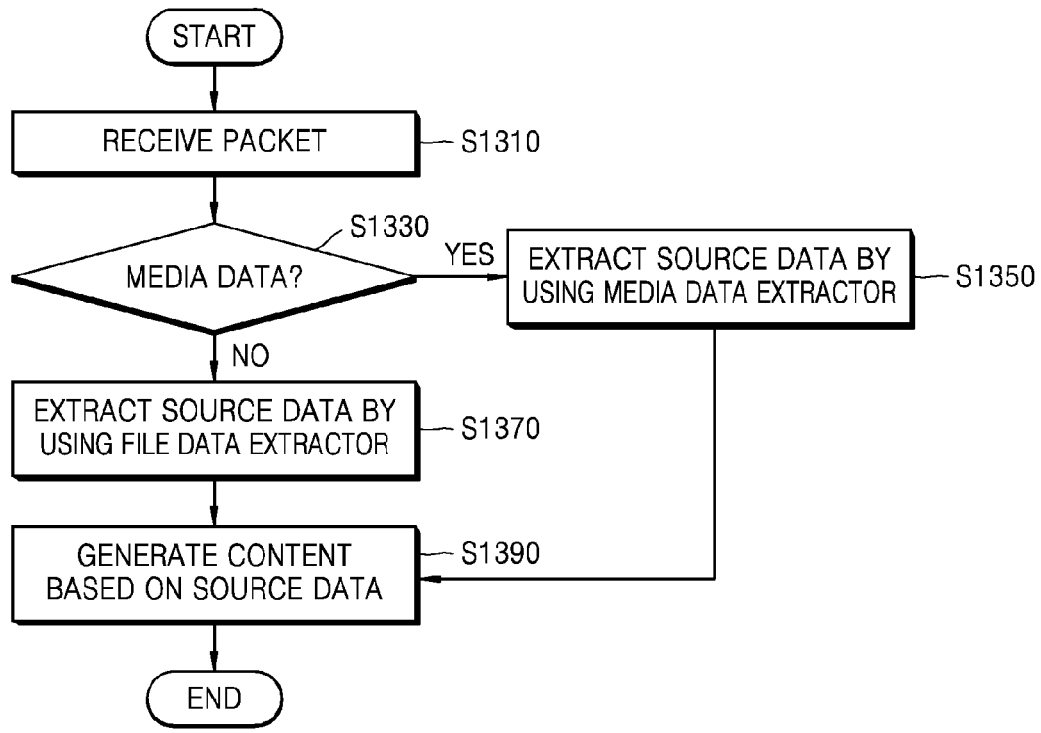
FIG. 13 is a detailed flowchart of a method of, if the second device receives a packet, generating content based on the received packet, which is performed by the second device, according to an exemplary embodiment.

FIG. 13 is a detailed flowchart of a method of, if the second device 200 receives a packet, generating content based on the received packet, which is performed by the second device 200, according to an exemplary embodiment.

In operation S1310, the second device 200 may determine whether the packet is media data. According to some exemplary embodiments, the second device 200 may determine whether the packet is media data by checking whether the packet has an MPU with a particular structure.

In operation S1350, if the received packet is media data with an MPU having a particular structure, the second device 200 may recover source data, that is, the MPU, by using a media data recoverer 1650 included in the second device 200.

In operation S1370, otherwise, if the received packet is not media data with an MPU having a particular structure, the second device 200 may recover source data by using a file data recoverer 1640.

According to some exemplary embodiments, the media data recoverer 1650 and the file data recoverer 1640 may be included in the first processor 1110.

In operation S1390, the second device 200 may generate content based on source data extracted by using the media data recoverer 1650 or the file data recoverer 1640.

The generating of the content based on the source data, which is performed by the second device 200, may represent that content transmitted by the first device 100 is recovered or reassembled based on the received data. In other words, content generated based on the source data received by the second device 200 may be the same as or different from content transmitted by the first device 100.

According to some exemplary embodiments, operation S1390 may be performed by at least one processor included in the second device 200.

According to some exemplary embodiments, each operation described with reference to FIG. 13 may be applied to a case where a plurality of packets are received at the same time. In other words, if a plurality of pieces of content are generated based on each packet, each content may be generated based on each operation described with reference to FIG. 13.

Additionally, according to some exemplary embodiments, source data may be recovered by using one recoverer without having to differentiate media data from other data. In other words, the media data recoverer 1650 and the file data recoverer 1640 may be included in one recoverer.

Figure 14:
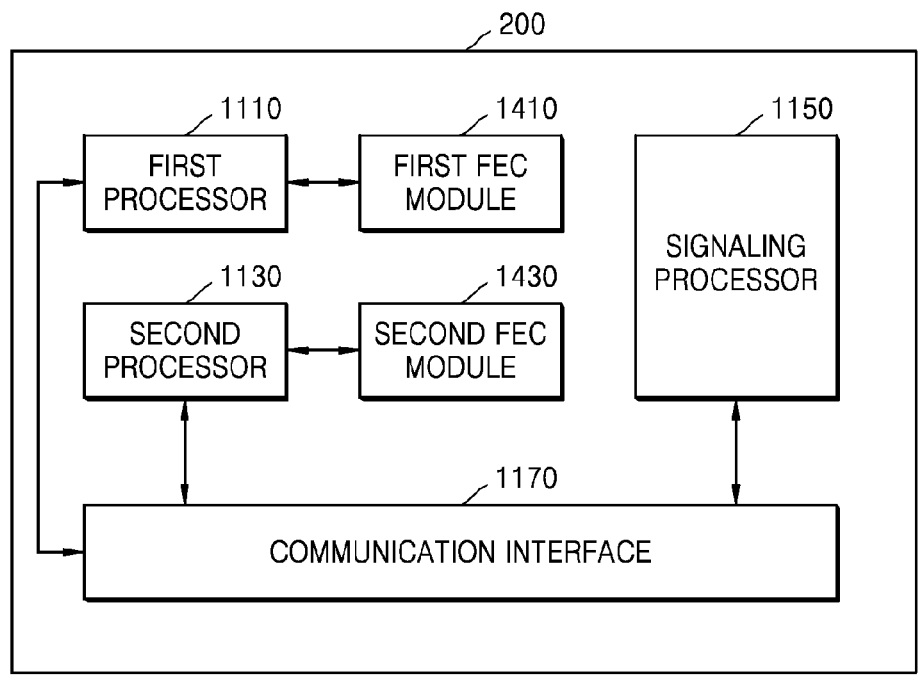
FIG. 14 is a block diagram of the second device for receiving an FEC-protected packet and generating content based on the received FEC packet, according to an exemplary embodiment.

FIG. 14 is a block diagram of the second device 200 for receiving an FEC-protected packet and generating content based on the received FEC packet, according to an exemplary embodiment.

If a packet is transmitted from the first device 100 to the second device 200, while the packet is being received by the second device 200, an error may occur in the packet.

If an error has occurred in the packet, various error correction methods for correcting an error may be employed to generate a packet. According to some exemplary embodiments, the first device 100 may generate a first packet and a second packet by using an FEC method and transmit the generated first and second packets to the second device 200. The second device 200 may receive the first packet and the second packet from the first device 100. The first packet may include a first FEC source packet and a first FEC repair packet, and the second packet may include a second FEC source packet and a second FEC repair packet.

As shown in FIG. 14, the second device 200 may further include a first FEC module 1410 for generating a first MMTP packet by recovering a lost first FEC source packet and a second FEC module 1430 for generating a second MMTP packet by recovering a lost second FEC source packet to decode and process multiple packets received from the first device 100 in parallel.

In the above embodiment, the first FEC module 1410 and the second FEC module 1430 are independent from each other, and thus, interaction between content may not occur.

According to some exemplary embodiments, an FEC source packet is a packet generated based on source data, and an FEC repair packet may include a packet that includes data for correcting an error that may occur in the packet. The FEC source packet and the FEC repair packets may allow the second device 200 to correct errors without requesting retransmission.

However, if an error occurs but the error is determined as an error that may not be corrected by using the FEC repair packet, the second device 200 may request the first device 100 to retransmit the packets.

Figure 15:
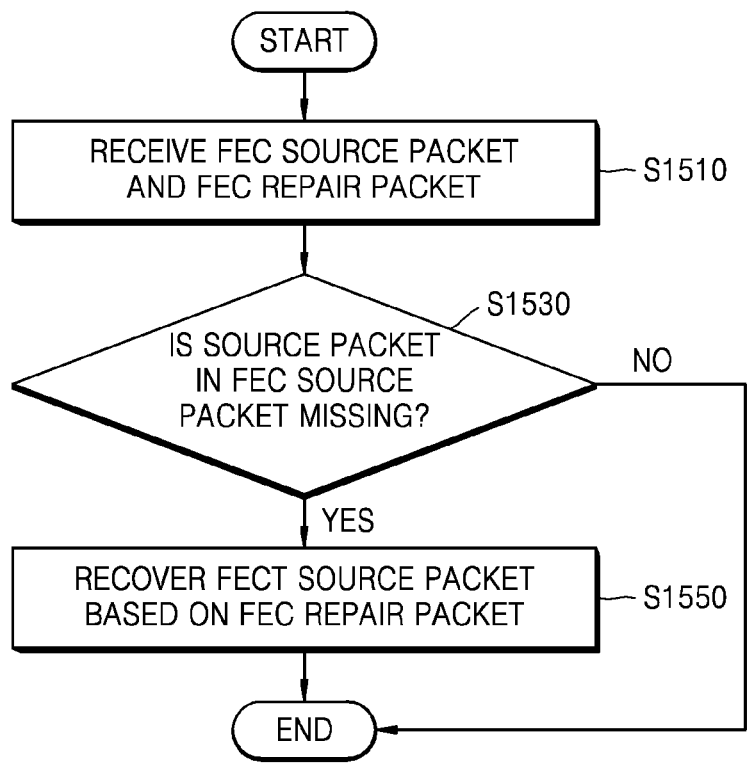
FIG. 15 is a flowchart of a method of receiving and recovering an FEC-protected packet, which is performed by the second device, according to an exemplary embodiment.

FIG. 15 is a flowchart of a method of receiving and recovering an FEC-protected packet, which is performed by the second device 200, according to an exemplary embodiment.

In operation S1510, the second device 200 may receive an FEC source packet and an FEC repair packet. According to some exemplary embodiments, a communication interface included in the second device 200 may receive an FEC source packet and an FEC repair packet.

In operation S1530, the second device 200 may determine whether an error has occurred in the FEC source packet.

If an error has occurred in the FEC source packet, the second device 200 may recover the FEC source packet based on the FEC repair packet in operation S1550.

According to some exemplary embodiments, if an error has occurred in the FEC source packet, the second device 200 may determine whether the error in the FEC source packet may be corrected. Based on a result of the determining, the second device 200 may recover the FEC source packet based on the FEC repair packet, or request the first device 100 to retransmit the FEC source packet in which the error occurred, Operations S1530 and S1550 may be performed respectively by the first FEC module 1410 and the second FEC module 1430. Since the first FEC module 1410 and the second FEC module 1430 do not affect each other, operations S1530 and S1550 may be performed in parallel so that interaction between pieces of content does not occur.

Figure 16:
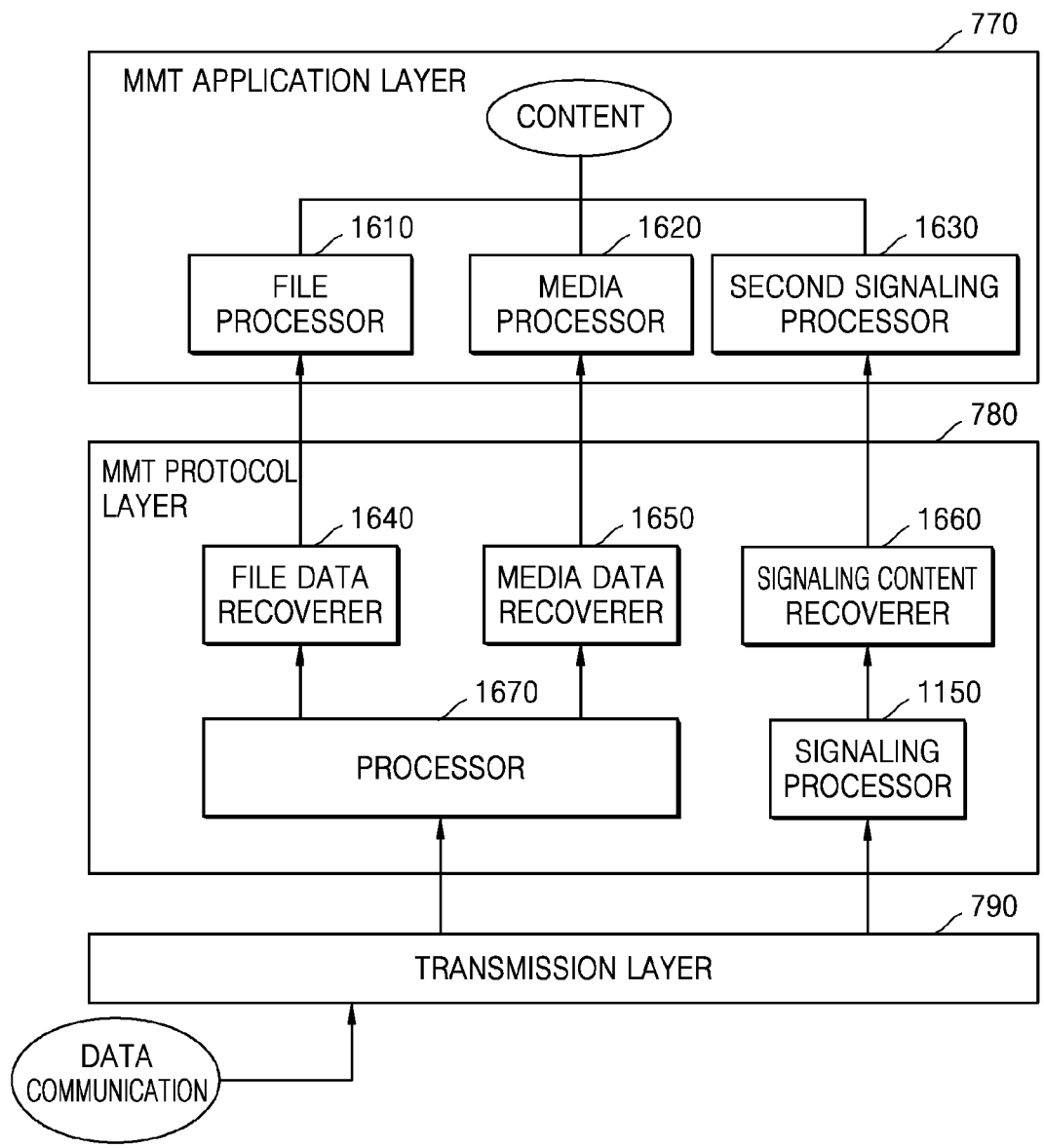
FIG. 16 illustrates a sequential process of receiving one piece of content and generating content based on the received packet, which is performed by each MMT layer via the second device, according to an exemplary embodiment.

FIG. 16 illustrates a sequential process of receiving one piece of content and generating content based on the received packet, which is performed by each MMT layer via the second device 200, according to an exemplary embodiment.

In the current embodiment, an MMT architecture may have a logical structure.

An architecture may mean a model or a structure of a network which is fragmented by a defined protocol. According to exemplary embodiment, and elements of the first and second devices 100 and 200 may perform operations that are to be performed at each layer.

According to some exemplary embodiments, an MMT architecture of the second device 200 may include an MMT application layer 770, an MMT protocol layer 780, and a transmission layer 790.

According to some exemplary embodiments, the transmission layer 750 of the first device 100 and the transmission layer 790 of the second device 200 may be connected to each other via a data channel. According to some exemplary embodiments, the data channel may include various communication media via which data is transceived. The communication media may include a wired communication medium and a wireless communication medium.

According to some exemplary embodiments, the transmission layer 790 of the second device 200 may receive an MMTP packet, an FEC source packet, an FEC repair packet, and a signaling packet which are transmitted from the first device 100. A setting of the transmission layer 790 for receiving a signaling packet and a setting of the transmission layer 790 for receiving packets such as an MMTP packet, other than the signaling packet, may be different from each other. For example, if data is received in a channel with a lot of noise, an MMTP packet may be received by an upper layer of a UDP protocol whereas a signaling message is received by an upper layer of a TCP protocol.

The MMT protocol layer 780 of the second device 200 may unpack a packet received by using a processor 1670 and the signaling processor 1150. Then, if the unpacked data is media data, the MMT protocol layer 780 may recover source data by using the media data recoverer 1650. If the unpacked data is not media data, the MMT protocol layer 780 may recover source data by using the file data recoverer 1640.

According to some exemplary embodiments, the second device 200 may recover source data by using a data recoverer.

According to some exemplary embodiments, a process of recovering source data, which is performed by the MMT protocol layer 780 of the second device 200, may correspond to each operation described with reference to FIG. 13.

According to some exemplary embodiments, generating of first content based on a first packet, generating of second content based on a second packet, and generating of signaling content based on a signaling packet may be performed in parallel by the MMT protocol layer 780 of the second device 200. This corresponds to the description provided with reference to FIG. 12.

According to some exemplary embodiments, a file processor 1610 may recover source data, recovered by using the file data recoverer 1640, as content and a media processor 1620 may recover source data, recovered by using the file data recoverer 1640, as content. A second signaling processor 1630 may recover source data, recovered by using the signaling content recoverer 1660, as signaling content.

According to exemplary embodiments, the second device 200 may not include the file processor 1610, the media processor 1620, and the second signaling processor 1630.

According to another exemplary embodiment, if a loss of an FEC source packet occurs at the MMT protocol layer 780, the FEC source packet may be recovered based on an FEC repair packet. The recovered FEC source packet may be generated as an MMTP packet.

According to an exemplary embodiment, the signaling processor 1150 may unpack a signaling packet, the signaling content recoverer 1660 may recover source data based on the unpacked signaling packet, and the second signaling processor 1630 may generate signaling content that includes MMT ADC or MMT CI based on the recovered source data.

According to another exemplary embodiment, the signaling processor 1150, the signaling content recoverer 1660, and the second signaling processor 1630 for processing a signaling packet may not be present separately.

According to some exemplary embodiments, the processor 1670 may recover source data instead of the media data recoverer 1650 and the file data recoverer 1640. According to some exemplary embodiments, the second device 200 may receive a signaling packet transmitted from the first device 100 and may also generate and transmit a signaling packet to the first device 100.

Figure 17:
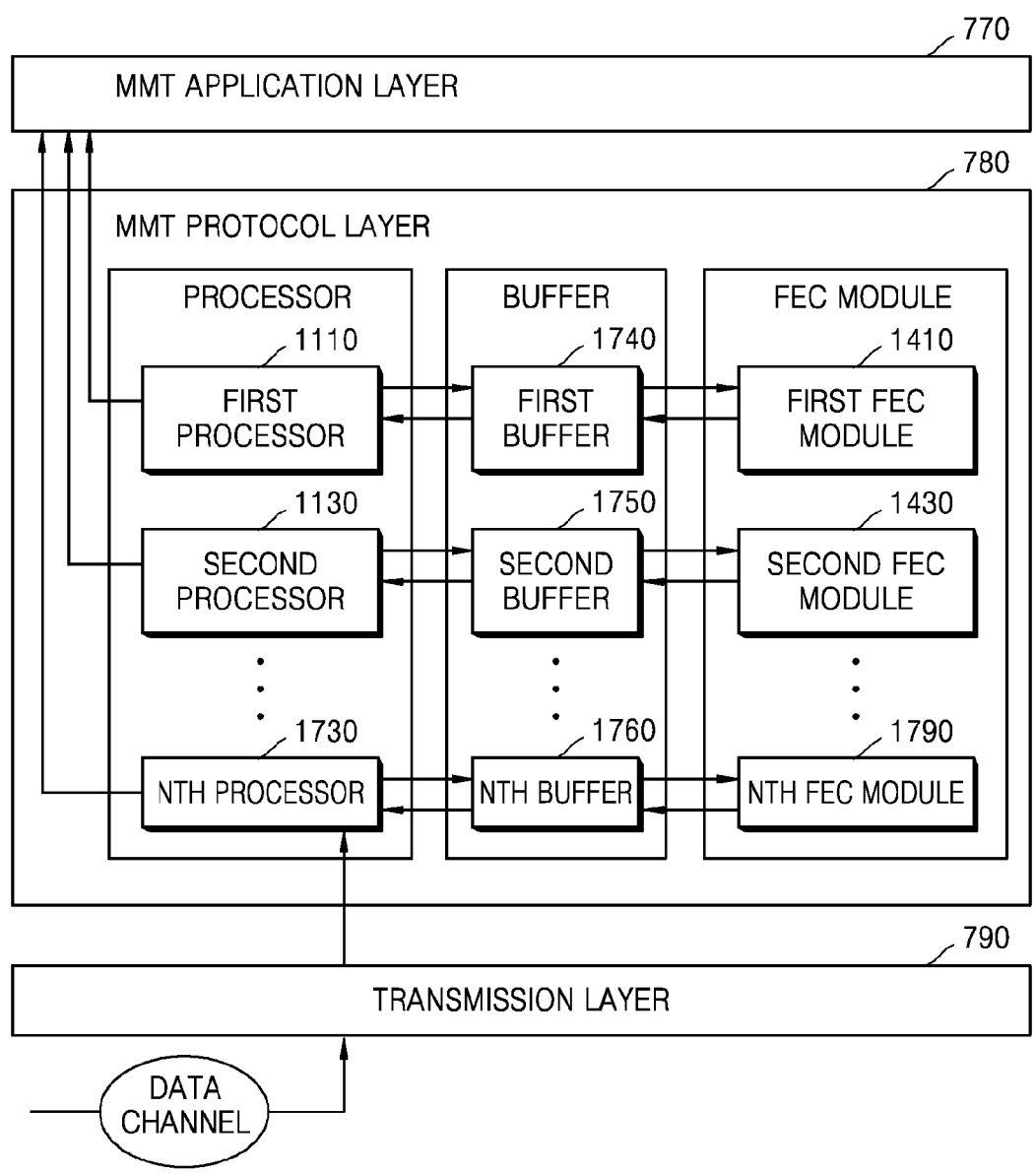
FIG. 17 illustrates a sequential process of receiving a plurality of packets and generating content based on the received plurality pieces of packets, which is performed by each MMT layer via the second device, according to an exemplary embodiment.

FIG. 17 illustrates a sequential process of receiving a plurality of packets and generating content based on the received plurality pieces of packets, which is performed by each MMT layer structure via the second device 200, according to an exemplary embodiment The second device 200 may dynamically allocate processors, buffers, and FEC modules in correspondence with the number of received packets.

If an FEC-protected packet is received, processors, buffers, and FEC modules may be dynamically allocated by regarding an FEC source packet and an FEC repair packet as one packet.

As shown in FIG. 17, a received first FEC repair packet and a received first FEC source packet may be transmitted from the transmission layer 790 to the first processor 1110, and then, stored in a first buffer 1740. The first FEC module 1410 may recover the first FEC source packet by using the first FEC repair packet and generate a first MMTP packet based on the recovered source data. According to some exemplary embodiment, a process of recovering an FEC source packet by using an FEC repair packet and generating an MMTP packet may correspond to each operation described with reference to FIG. 15.

According to some exemplary embodiment, a received second FEC repair packet and a received second FEC source packet may be transmitted from the transmission layer 790 to the second processor 1130, and then, stored in a second buffer 1750. The second FEC module 1430 may recover the second FEC source packet by using the second FEC repair packet and generate a second MMTP packet based on the recovered source data.

According to some exemplary embodiments, the same processes as a process of the generating of the first MMTP packet, which is performed with respect to the first FEC repair packet and the first FEC source packet, and a process of the generating of the second MMTP packet, which is performed with respect to the second FEC repair packet and the second FEC source packet, may be performed in parallel in correspondence with the number of pieces of content.

A received Nth FEC repair packet and a received Nth FEC source packet may be transmitted from the transmission layer 790 to an Nth processor 1730, and then, stored in an Nth buffer 1760. The Nth FEC module 1770 may recover the Nth FEC source packet by using the Nth FEC repair packet and generate an Nth MMTP packet based on the recovered source data.

A whole or a part of a process of generating each MMTP packet may be performed at the same time, or may be performed independently without interacting with each other.

According to an exemplary embodiment, generated MMTP packets are transmitted to the processor 1670 via a buffer, unpacked and recovered as source data, and then, recovered as content via the MMT application layer 770.

According to another exemplary embodiment, if error correction is not necessary, the transmission layer 790 may directly receive an MMTP packet instead of an FEC source packet and an FEC repair packet. If the transmission layer 790 receives an MMTP packet, the processor 1670 may unpack the MMTP packet without having to use an FEC module.

According to an exemplary embodiment, an advance has been made in that a volume of data that may be transceived by a device is increased compared to a case where a plurality of pieces of data are sequentially transceived. The difference between an exemplary embodiment of transceiving a plurality of pieces of data in parallel and a case where a plurality of pieces of data are sequentially transceived is shown in the following table:

| | Volume of received data | | | | |
|---|---|---|---|---|---|
| | Case where data is sequentially transceived | | Exemplary embodiment | | |
| Test case | Size of received data (KB) | Information missing rate | Size of received data (KB) | Information missing rate | Size of transmitted data (KB) |
| Web camera data (1 Mbps bitrate) + Video file (2.86 Mbps bitrate) | 826 | 10% | 930 | −1% | 920 |
| | 2119 | 15% | 2502 | 0% | 2502 |
| Web camera data (1 Mbps bitrate) + Video file (2.86 Mbps bitrate) flow + Video file (2.97 Mbps bitrate) flow | 657 | 28% | 920 | 0% | 920 |
| | 1940 | 22% | 2502 | 0% | 2502 |
| | 2133 | 17% | 2576 | 0% | 2576 |

The table is shown with reference to a total size of data transceived for 8 seconds by a reception device under the same data channel conditions.

As shown in the table, if one piece of web camera data and a video file with a 2.86 Mbps bitrate are transmitted at the same time, it may be determined that data of 10 KB is further received for 8 seconds in addition to the total web camera data amount of 920 KB, and thus, an information missing rate is −1% according to an exemplary embodiment, whereas only data of 826 KB from among a total web camera data amount of 920 KB is received for 8 seconds and an information missing rate is 10% in the case where data is sequentially transceived.

Additionally, if one piece of web camera data, a video file with a 2.86 Mbps bitrate, and another video file with a 2.97 Mbps bitrate are transmitted at the same time, that is, if three pieces of content are transmitted at the same time, it may be determined that the total web camera data amount of 920 KB is received, and thus, an information missing rate is 0% according to an exemplary embodiment, whereas only data of 657 KB from among the total web camera data amount of 920 KB is received for 8 seconds and an information missing rate is 28% in the case where data is sequentially transceived.

In other words, if two pieces of content are transmitted at the same time, a data reception rate according to an exemplary embodiment is higher than that in the case where data is sequentially transceived. Additionally, when three pieces of content are transmitted at the same time, a difference in a data reception rate between an exemplary embodiment and the case where data is sequentially transceived is greater than when two pieces of content are transmitted at the same time.

Thus, it may be inferred that a difference in a data reception rate between an exemplary embodiment and the case where data is sequentially transceived may be increased as the number of pieces of content transmitted at the same time is increased.

As described above, according to the one or more of the above exemplary embodiments, a degree of resource use may be increased and a speed and quality of data transception may be enhanced by using a respective process for each content.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A device for transmitting a packet comprising:
   a first processor configured to generate a first packet based on a first content;
   a second processor configured to generate a second packet based on a second content independently from the first processor;
   a signaling processor configured to generate a signaling packet based on information extracted from the first content and the second content; and
   a communication interface configured to transmit the first packet, the second packet, and the signaling packet separately from each other in parallel,
   wherein the first processor, the second processor, and the signaling processor
   respectively generate the first packet, the second packet, and the signaling packet in parallel, and
   wherein the first processor comprises a media data extractor configured to extract source data in response to the first content corresponding to media data, and a file data extractor configured to extract source data in response to the first content not corresponding to media data.

2. The device of claim 1, wherein the media data extractor and the file data extractor are operated in a MMT application layer of the first processor to extract the source data respectively from the media data and the file data.

3. The device of claim 1, wherein:
   the media data extractor configured to extract the source data in response to the first content being determined as media data based on a moving picture experts group (MPEG) media transport (MMT) processing unit (MPU) format of the first content;
   the file data extractor configured to extract the source data in response to the first content being determined as file data differentiated from the media data;
   the first processor is further configured to generate the first packet based on the extracted source data; and
   the signaling packet comprises MMT asset delivery characteristics (MMT ADC) or MMT composition information (MMT CI) extracted from the first content and the second content.

4. The device of claim 1, wherein the first processor comprises a first buffer configured to store the first packet, and
   the second processor comprises a second buffer configured to store the second packet.

5. The device of claim 1, wherein the device further comprises one or more processors implementing:
   a first forward error correction (FEC) module configured to generate a first FEC repair packet and a first FEC source packet based on the first packet; and
   a second FEC module configured to generate a second FEC repair packet and a second FEC source packet based on the second packet,
   wherein the communication interface is further configured to transmit the first FEC repair packet, the first FEC source packet, the second FEC repair packet, and the second FEC source packet.

6. The device of claim 1, wherein the device is further configured to determine a number of packets to be generated in parallel based on a number of contents to be transmitted.

7. The device of claim 1, wherein the first packet and the second packet have a MMT format.

8. A device for receiving a packet comprising:
   a communication interface configured to receive a first packet, a second packet, and a signaling packet separately from each other in parallel;
   a first processor configured to generate a first content based on the first packet;
   a second processor configured to generate a second content based on the second packet independently from the first processor; and
   a signaling processor configured to generate a signaling content for the first packet and the second packet based on the signaling packet,
   wherein the first processor, the second processor, and the signaling processor generate the first packet, the second packet, and the signaling packet in parallel,
   wherein the first processor comprises a media data recoverer configured to generate source data in response to the first content corresponding to media data, and a file data recoverer configured to generate source data in response to the first content not corresponding to media data.

9. The device of claim 8, wherein:
   the media data recoverer configured to generate source data in response to the first content being determined as media data based on a moving picture experts group (MPEG) media transport (MMT) processing unit (MPU) format of the first content;
   the file data recoverer configured to generate source data in response to the first content being determined as file data differentiated from the media data;
   the first content is generated based on the source data, and the signaling, packet comprises MMT asset delivery characteristics (MMT ADC) or MMT composition information (MMT CI) extracted from the first content and the second content.

10. The device of claim 8, wherein the first processor comprises a first buffer configured to store the first packet, and
the second processor comprises a second buffer configured to store the second packet.

11. The device of claim 8, wherein the first packet comprises a first forward error correction (FEC) packet and a first FEC source packet, and the second packet comprises a second FEC packet and a second FEC source packet, further comprising one or more processors implementing:
a first FEC module configured to recover the first FEC source packet based on the first FEC repair packet in response to an error occurring in the first packet; and
a second FEC module configured to recover the second FEC repair packet based on the second FEC repair packet in response to an error occurring in the second packet.

12. The device of claim 8, further comprising a processor configured to determine a number of contents to be generated in parallel based on a number of packets received by the device.

13. The device of claim 8, wherein the first packet and the second packet have a MMT format.

14. A method of transmitting data performed by a transceiver, the method comprising:
generating a first packet based on a first content;
generating a second packet based on a second content independently from the generating the first packet;
generating a signaling packet based on information extracted from the first content and the second content; and
transmitting the first packet, the second packet, and the signaling packet separately from each other in parallel,
wherein the generating the first packet, the second packet, and the signaling packet are performed in parallel,
wherein the generating the first packet comprises extracting source data by a media data extractor of the transceiver in response to the first content corresponding to media data, and extracting source data by a file data extractor of the transceiver in response to the first content not corresponding to media data.

15. The method of claim 14, wherein the generating the first packet comprises extracting source data by a media data extractor of the transceiver in response to the first content being determined as media data based on a moving picture experts group (MPEG) media transport (MMT) processing unit (MPU) format of the first content, and extracting source data by a file data extractor of the transceiver in response to the first content being determined as file data differentiated from the media data,
wherein the first packet is generated based on the extracted source data,
wherein the signaling packet comprises MMT asset delivery characteristics (MMT ADC) or MMT composition information (MMT CI) extracted from the first content and the second content.

16. The method of claim 14, wherein the generating the first packet and the second packet comprises:
storing the first packet in a first buffer of the transceiver; and
storing the second packet in a second buffer of the transceiver.

17. The method of claim 14, wherein the generating the first packet comprises:
generating a first forward error correction (FEC) repair packet and a first FEC source packet based on the first packet; and
transmitting the FEC repair packet and the first FEC source packet.

18. The method of claim 14, further comprising determining a number of packets to be generated in parallel based on a number of contents to be transmitted.

19. A method of receiving data performed by a transceiver, the method comprising:
receiving a first packet, a second packet, and a signaling packet separately from each other in parallel;
generating a first content based on the first packet;
generating a second content based on the second packet independently from the generating the first content; and
generating a signaling content based on the signaling packet,
wherein the generating the first packet, the second packet, and the signaling packet is performed in parallel,
wherein the generating the first content comprises generating source data by a media data recoverer of the transceiver in response to the received first packet corresponding to a media packet and generating source data by a file data recoverer of the transceiver in response to the received first packet not corresponding to a media packet.

20. The method of claim 19, wherein the generating the first content comprises generating source data by a media data recoverer of the transceiver in response to the received first packet being determined as media data based on a moving picture experts group (MPEG) media transport (MMT) processing unit (MPU) format of the received first packet and generating source data by a file data recoverer of the transceiver in response to the received first packet being determined as file data differentiated from the media data,
wherein the first content is generated based on the source data, and
wherein the signaling packet comprises MMT asset delivery characteristics (MMT ADC) or MMT composition information (MMT CI) extracted from the first content and the second content.

21. The method of claim 19, wherein the generating the first packet and the second packet comprises:
storing the first packet in a first buffer of the transceiver; and
storing the second packet in a second buffer of the transceiver.

22. The method of claim 19, wherein the first packet comprises a first forward error correction (FEC) packet and a first FEC source packet, and the second packet comprises a second FEC repair packet and a second FEC source packet, and
wherein the generating the first content comprises recovering the first FEC source packet based on the first FEC repair packet in response an error occurring in the first FEC source packet.

23. The method of claim 19, further comprising determining a number of contents to be generated in parallel based on a number of packets received by the transceiver.

24. A transceiver comprising one or more processors implementing:
a media data extractor configured to extract source data from a first content and a second content in response to a first packet and a second packet, which respectively include the first content and the second content, corresponding to a media packet;
a file data extractor configured to extract source data from the first content and the second content in response to the first packet and the second packet not corresponding to a media packet;

a first error correction module configured to generate a first source packet and a first repair packet based on a first error correction code and the source data extracted from the first content;

a second error correction module configured to generate a second source packet and a second repair packet based on a second error correction code and the source data extracted from the second content; and a signal processor configured to extract signaling information from the first content and the second content and generate a signaling packet based on the extracted signaling information;

wherein the first error correction module, the second error correction module, and the signaling processor respectively generate the first source packet, the second source packet, and the signaling packet in parallel.

25. The transceiver of claim 24, wherein the data extractor is further configured to extract the source data in a MMT application layer of the transceiver, and the first and second error correction modules are further configured to generate the first and second source packets in a MMT protocol layer of the transceiver.

* * * * *